US012633889B2

(12) United States Patent
Zhang

(10) Patent No.: US 12,633,889 B2
(45) Date of Patent: May 19, 2026

(54) FILTER, RECEIVER FOR PROCESSING RADIO FREQUENCY SIGNALS AND CALIBRATION METHOD

(71) Applicant: Realtek Semiconductor Corporation, Hsinchu (TW)

(72) Inventor: Zhen Cheng Zhang, Hsinchu (TW)

(73) Assignee: Realtek Semiconductor Corporation, Hsinchu (TW)

( * ) Notice: Subject to any disclaimer, the term of this patent is extended or adjusted under 35 U.S.C. 154(b) by 142 days.

(21) Appl. No.: 18/638,663

(22) Filed: Apr. 17, 2024

(65) Prior Publication Data

US 2024/0372520 A1 Nov. 7, 2024

(30) Foreign Application Priority Data

May 2, 2023 (TW) ................................. 112116331

(51) Int. Cl.
　*H03H 7/01* (2006.01)
　*H04B 1/10* (2006.01)
　*H04B 17/21* (2015.01)

(52) U.S. Cl.
　CPC ............ *H03H 7/0161* (2013.01); *H03H 7/17* (2013.01); *H04B 1/10* (2013.01); *H04B 17/21* (2015.01)

(58) Field of Classification Search
　CPC ...... H04B 15/005; H04B 17/11; H04B 17/21; H03H 11/126; H03H 11/1286; H03H 11/22; H03H 2011/0494; H03H 11/04; H03H 11/1217; H03H 11/1291; H03H 11/54; H03H 7/0161; H03H 7/06; H03H 7/17
　See application file for complete search history.

(56) References Cited

U.S. PATENT DOCUMENTS

2005/0186930 A1* 8/2005 Rofougaran ....... H03H 21/0001
　　　　　　　　　　　　　　　　455/260
2010/0297961 A1* 11/2010 Chien .................. H04B 1/1027
　　　　　　　　　　　　　　　　455/84

OTHER PUBLICATIONS

Kim et al., "A Complex Band-Pass Filter for Low-IF Conversion DAB/T-DMB Tuner with I/Q Mismatch Calibration", IEEE Asian Solid-State Circuits Conference, Nov. 3-5, 2008, pp. 473-476 (Year: 2008).*

(Continued)

*Primary Examiner* — Lincoln D Donovan
*Assistant Examiner* — Tyler J Pereny
(74) *Attorney, Agent, or Firm* — CKC & Partners Co., LLC

(57) ABSTRACT

A filter includes a first low-pass filter and a second low-pass filter. The first low-pass filter is located at a first channel, and includes a first resistor array coupled with a complex-signal input terminal. The second low-pass filter is located at a second channel, and includes a second resistor array coupled with the complex-signal input terminal. The complex-signal input terminal is configured to provide complex signals to the first channel and the second channel. The filter further includes a third resistor array and a fourth resistor array. The third resistor array is cross-coupled between the first low-pass filter and the second low-pass filter. The fourth resistor array is coupled between the complex-signal input terminal and the third resistor array. The first resistor array, the second resistor array and the fourth resistor array include variable resistors.

20 Claims, 6 Drawing Sheets

(56) References Cited

OTHER PUBLICATIONS

Yang Xu et al., "Power-Scalable, Complex Bandpass/Low-Pass Filter With I/Q Imbalance Calibration for a Multimode GNSS Receiver", IEEE Transactions on Circuits and Systems-II: Express Briefs, vol. 59, No. 1, Jan. 2012, pp. 30-34.

Seyeob Kim et al., "A Complex Band-Pass Filter for Low-IF Conversion DAB/T-DMB Tuner with I/Q Mismatch Calibration", IEEE Asian Solid-State Circuits Conference, Nov. 3-5, 2008, pp. 473-476.

Kenichi Shibata et al., "A 22nm 0.84mm2 BLE Transceiver with Self IQ-Phase Correction Achieving 39dB Image Rejection and On-Chip Antenna Impedance Tuning", IEEE International Solid-State Circuits Conference (ISSCC), Feb. 24, 2022, pp. 398-400.

* cited by examiner

400

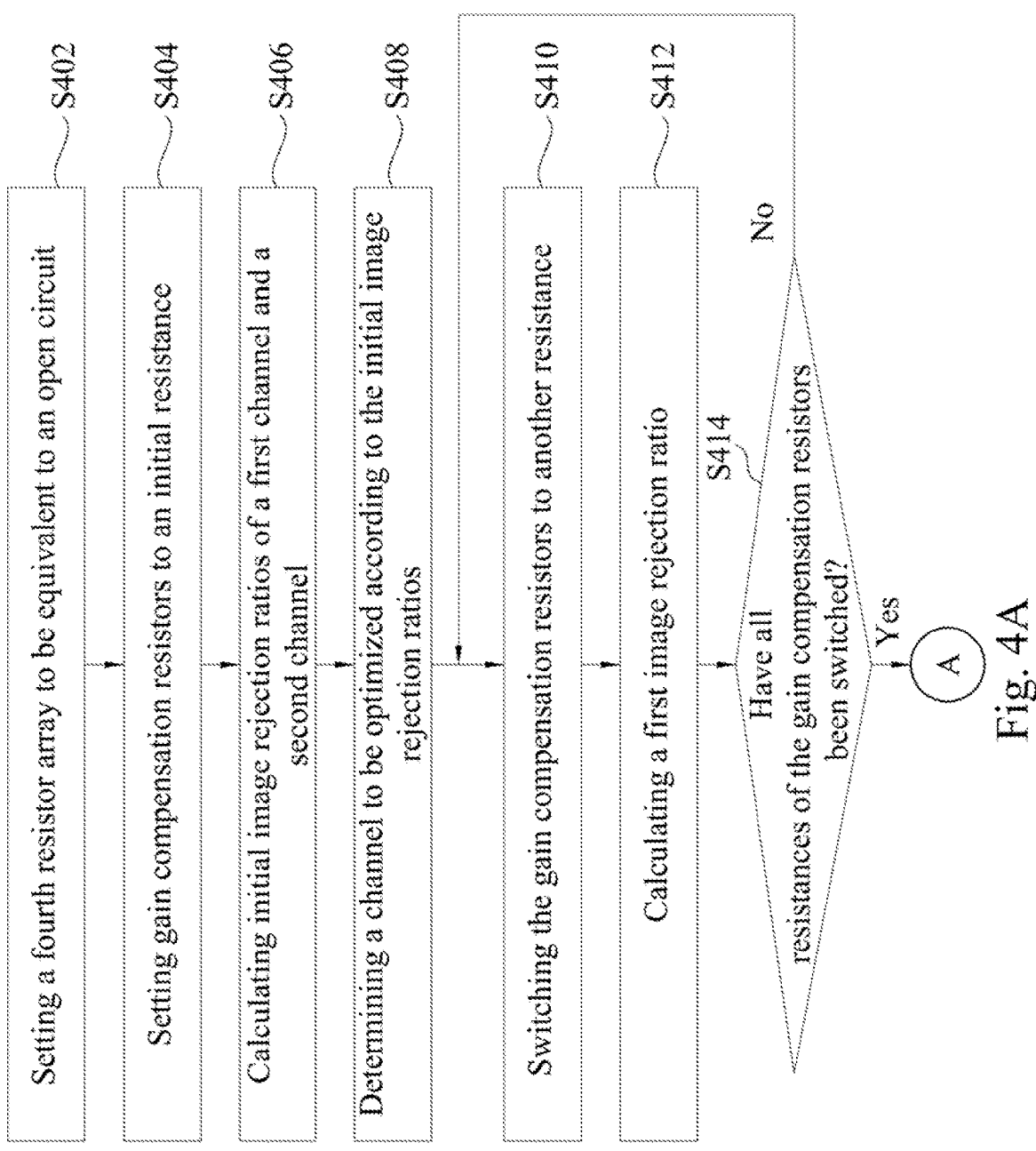

S402 — Setting a fourth resistor array to be equivalent to an open circuit

S404 — Setting gain compensation resistors to an initial resistance

S406 — Calculating initial image rejection ratios of a first channel and a second channel S408 — Determining a channel to be optimized according to the initial image rejection ratios S410 — Switching the gain compensation resistors to another resistance S412 — Calculating a first image rejection ratio S414 — Have all resistances of the gain compensation resistors been switched?

No

Yes

FILTER, RECEIVER FOR PROCESSING RADIO FREQUENCY SIGNALS AND CALIBRATION METHOD

RELATED APPLICATIONS

This application claims priority to Taiwan Application Serial Number 112116331, filed on May 2, 2023, which is herein incorporated by reference in its entirety.

BACKGROUND

Technical Field

The present disclosure relates to a circuit design technology. More particularly, the present disclosure relates to a filter, a receiver configured to process radio frequency (RF) signals and a calibration method.

Description of Related Art

Receivers for RF signals typically utilize a local oscillator and a mixer to downconvert the RF signals. If the frequencies of interfering signal and the target signal are mirror symmetric around the local oscillator frequency, the interfering signal and the target signal will have similar center frequencies after being processed through the mixer. This causes conventional band-pass filters to be unable to eliminate the interfering signals. Such interfering signal is called the image signal, while the interference thereof is called the image interference. A complex band-pass filter can be configured to filter image signals, but when a mismatch is occurred on the phases or the gains between the two paths of the complex band-pass filter, the ability of the complex band-pass filter to suppress image interference will be reduced.

SUMMARY

The present disclosure provides a filter comprising a first low-pass filter and a second low-pass filter. The first low-pass filter is located at a first channel, and comprises a first resistor array coupled to a complex-signal input terminal. The second low-pass filter is located at a second channel and comprises a second resistor array coupled to the complex-signal input terminal. The complex-signal input terminal is configured to provide complex signals to the first channel and the second channel. The filter further comprises a third resistor array and a fourth resistor array. The third resistor array is cross coupled between the first low-pass filter and the second low-pass filter. The fourth resistor array is coupled between the complex-signal input terminal and the third resistor array. The first resistor array, the second resistor array and the fourth resistor array comprise variable resistors.

The present disclosure provides a receiver configured to process RF signals and comprising a first low-pass filter and a second low-pass filter. The first low-pass filter is located at a first channel, and comprises a first resistor array coupled to a complex-signal input terminal. The second low-pass filter is located at a second channel, and comprises a second resistor array coupled to the complex-signal input terminal. The complex-signal input terminal is configured to provide complex signals to the first channel and the second channel. The receiver further comprises a third resistor array, a fourth resistor array and a modulator-demodulator. The third resistor is cross coupled between the first low-pass filter and the second low-pass filter. The fourth resistor array is coupled between the complex-signal input terminal and the third resistor array. The modulator-demodulator is configured to determine resistance of the first resistor array, the second resistor array and the fourth resistor array according to signals received from at least one of the first channel and the second channel.

The present disclosure provides a calibration method for calibrating a receiver comprising a first low-pass filter and a second low-pass filter. The first low-pass filter is located at a first channel and comprises a first resistor array coupled to a complex-signal input terminal. The second low-pass filter is located at a second channel and comprises a second resistor array coupled to the complex-signal input terminal. The receiver further comprises a third resistor array cross coupled between the first low-pass filter and the second low-pass filter. The calibration method comprises: calculating a plurality of first image rejection ratios of the first channel corresponding to different resistance of the first resistor array and the second resistor array; determining resistance of each resistor in the first resistor array or the second resistor array according to a maximum value of the plurality of first image rejection ratios; calculating a plurality of second image rejection ratios of the first channel corresponding to different resistance of the fourth resistor array, wherein the fourth resistor array is coupled between the third resistor array and the complex-signal input terminal, and the complex-signal input terminal is configured to provide complex signals to the first channel and the second channel; and determining resistance of each resistor in the fourth resistor array according to a maximum value of the plurality of second image rejection ratios.

One of advantages of the aforementioned filter, receiver and calibration method is reducing the total circuit area.

It is to be understood that both the foregoing general description and the following detailed description are by examples, and are intended to provide further explanation of the disclosure as claimed.

BRIEF DESCRIPTION OF THE DRAWINGS

FIG. 4A is a flowchart of a calibration method according to one embodiment of the present disclosure.

DETAILED DESCRIPTION

Figure 1:
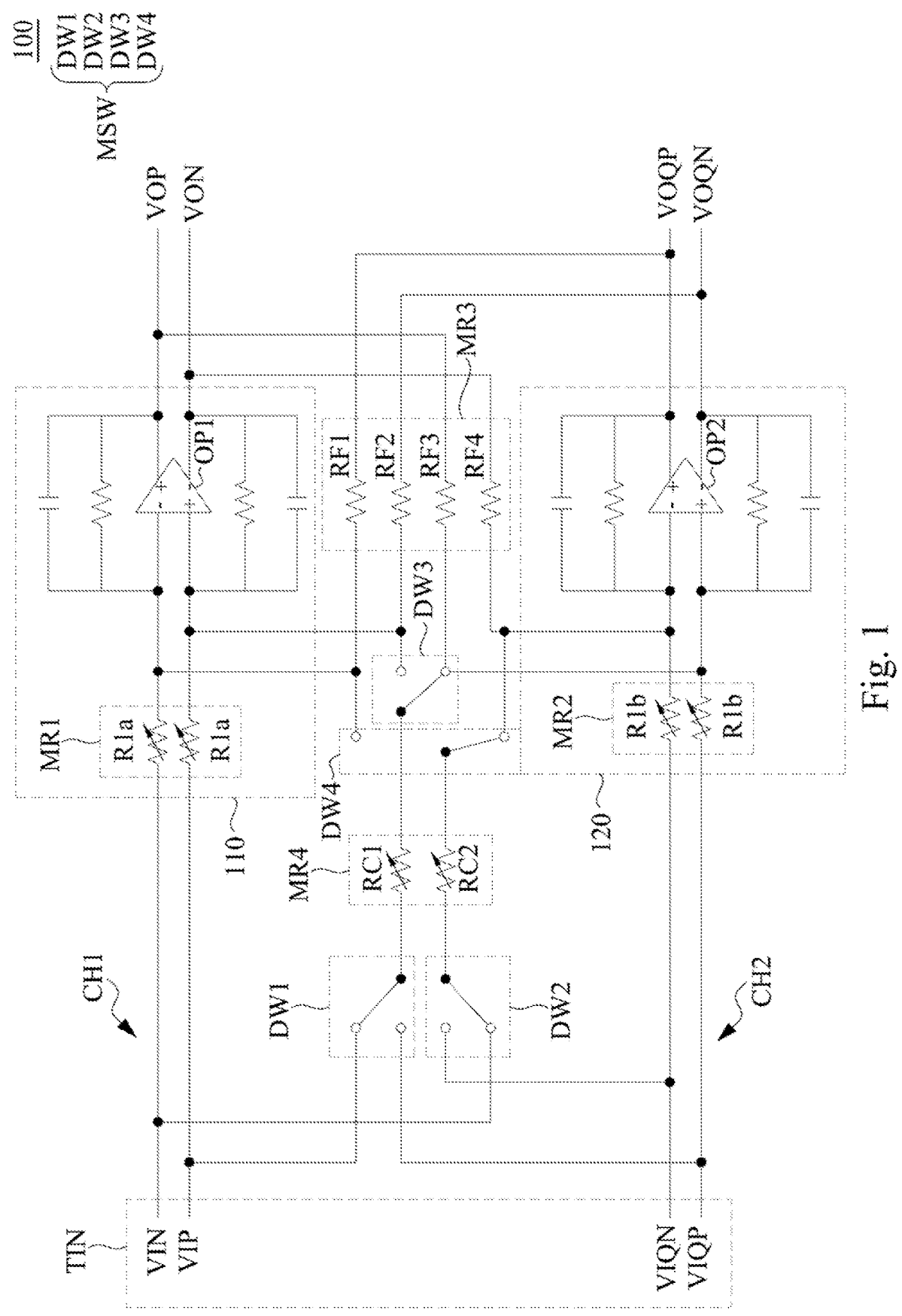
FIG. 1 is a simplified functional block diagram of a filter according to one embodiment of the present disclosure.

Reference will now be made in detail to the present embodiments of the disclosure, examples of which are illustrated in the accompanying drawings. Wherever possible, the same reference numbers are used in the drawings and the description to refer to the same or like parts.

FIG. 1 is a simplified functional block diagram of a filter 100 according to one embodiment of the present disclosure. The filter 100 comprises a first low-pass filter 110 and a second low-pass filter 120. The first low-pass filter 110 and the second low-pass filter 120 are integrators comprising operational amplifiers. For example, the first low-pass filter 110 comprises an operational amplifier OP1, and the second low-pass filter 120 comprises an operational amplifier OP2. However, low-pass filters in the present disclosure are not limited to integrators.

The first low-pass filter 110 is located at a first channel CH1, and comprises a first resistor array MR1. First terminals of a plurality of gain compensation resistors R1*a* in the first resistor array MR1 are configured to receive differential input signals VIP and VIN from a complex-signal input terminal TIN, respectively. Second terminals of the plurality of gain compensation resistors R1*a* in the first resistor array MR1 are coupled to inverting and non-inverting input terminals of the operational amplifier OP1, respectively.

The second low-pass filter 120 is located at a second channel CH2, and comprises a second resistor array MR2. First terminals of a plurality of gain compensation resistors R1*b* in the first resistor array MR2 are configured to receive differential input signals VIQP and VIQN from the complex-signal input terminal TIN, respectively. Second terminals of the plurality of gain compensation resistors R1*b* in the second resistor array MR2 are coupled to inverting and non-inverting input terminals of the operational amplifier OP2, respectively.

In some embodiments, the first channel CH1 may be the I-path in IQ modulation, and the second channel CH2 may be the Q-path. The complex-signal input terminal TIN is configured to provide complex signals to the first channel CH1 and the second channel CH2. For example, the complex-signal input terminal TIN may provide an in-phase input signal to the first channel CH1 and a quadrature input signal to the second channel CH2. In other words, the input signals VIP and VIN form the in-phase input signal, and the input signals VIQP and VIQN form the quadrature input signal. For example, the input signals VIP, VIN, VIQP and VIQN may have phases of 0°, 180°, 270° and 90°, respectively. However, the present disclosure is not limited to the aforementioned, the first channel CH1 and the second channel CH2 may also be the Q-path and the I-path, respectively.

The filter 100 further comprises a third resistor array MR3, a fourth resistor array MR4 and a switch array MSW. The third resistor array MR3 is cross coupled between the first low-pass filter 110 and the second low-pass filter 120. In some embodiments, the aforementioned "cross coupling" refers to: (1) feedback resistors RF1-RF2 of the third resistor array MR3 are coupled between inverting/non-inverting input terminals of the operational amplifier OP1 (i.e., the first low-pass filter 110) and the non-inverting/inverting output terminals of the operational amplifier OP2 (i.e., the second low-pass filter 120); and (2) feedback resistors RF3-RF4 of the third resistor array MR3 are coupled between non-inverting/inverting output terminals of the operational amplifier OP1 (i.e., the first low-pass filter 110) and the non-inverting/inverting input terminals of the operational amplifier OP2 (i.e., the second low-pass filter 120). By the aforementioned "cross coupling", a frequency shift is applied to the first low-pass filter 110 and the second low-pass filter 120 by the filter 100, so that the filter 100 reduces negative frequency signals and filters image signals. Therefore, the filter 100 is a complex band-pass filter.

The fourth resistor array MR4 is coupled between the complex-signal input terminal TIN and the third resistor array MR3 through a switch array MSW, in which the fourth resistor MR4 comprises phase compensation resistors RC1-RC2. The switch array MSW comprises first to fourth switches DW1-DW4, in which the first to fourth switches DW1-DW4 are single-pole double-throw switches. The first switch DW1 is configured to connect a first terminal of the phase compensation resistor RC1 to: (1) the non-inverting input terminal of first low-pass filter 110, to receive the differential input signal VIP; or (2) the non-inverting input terminal of second low-pass filter 120, to receive the differential input signal VIQP. The second switch DW2 is configured to connect a first terminal of the phase compensation resistor RC2 to: (1) the inverting input terminal of first low-pass filter 110, to receive the differential input signal VIN; or (2) the inverting input terminal of second low-pass filter 120, to receive the differential input signal VIQN.

In addition, the third switch DW3 is configured to connect a second terminal of the phase compensation resistor RC1 (1) to the non-inverting output terminal of the operational amplifier OP1 through the feedback resistor RF3, and to the non-inverting input terminal of the operational amplifier OP2 (i.e., to the non-inverting output terminal of the first low-pass filter 110 and the non-inverting input terminal of the second low-pass filter 120 indirectly); or (2) to the non-inverting input terminal of the operational amplifier OP1, and to the inverting output terminal of the operational amplifier OP2 through the feedback resistor RF2 (i.e., to the non-inverting input terminal of the first low-pass filter 110 and the inverting output terminal of the second low-pass filter 120 indirectly). The fourth switch DW4 is configured to connect a second terminal of the phase compensation resistor RC2 (1) to the inverting output terminal of the operational amplifier OP1 through the feedback resistor RF4, and to the inverting input terminal of the operational amplifier OP2 (i.e., to the inverting output terminal of the first low-pass filter 110 and the inverting input terminal of the second low-pass filter 120 indirectly); or (2) to the inverting input terminal of the operational amplifier OP1, and to the non-inverting output terminal of the operational amplifier OP2 through the feedback resistor RF1 (i.e., to the inverting input terminal of the first low-pass filter 110 and the non-inverting output terminal of the second low-pass filter 120 indirectly).

Accordingly, the switch array MSW has a first switching state and a second switching state, in which the first switching state is illustrated in FIG. 1. The first switching state is configured to connect the first channel CH1 to the second low-pass filter 120 through the fourth resistor array MR4. In the second switching state, all of the first to fourth switches DW1-DW4 are switched to different ports from FIG. 1. The second switching state is configured to connect the second channel CH2 to the first low-pass filter 110 through the fourth resistor array MR4. The first switching state and the second switching state are configured to compensate the phase difference in the second channel CH2 and the first channel CH1, respectively, in which the related content will be described in the following paragraphs with FIG. 4A-FIG. 4B.

In some embodiments, all of the resistors in the first resistor array MR1, the second resistor array MR2 and the fourth resistor array MR4 are variable resistors.

Figure 2:
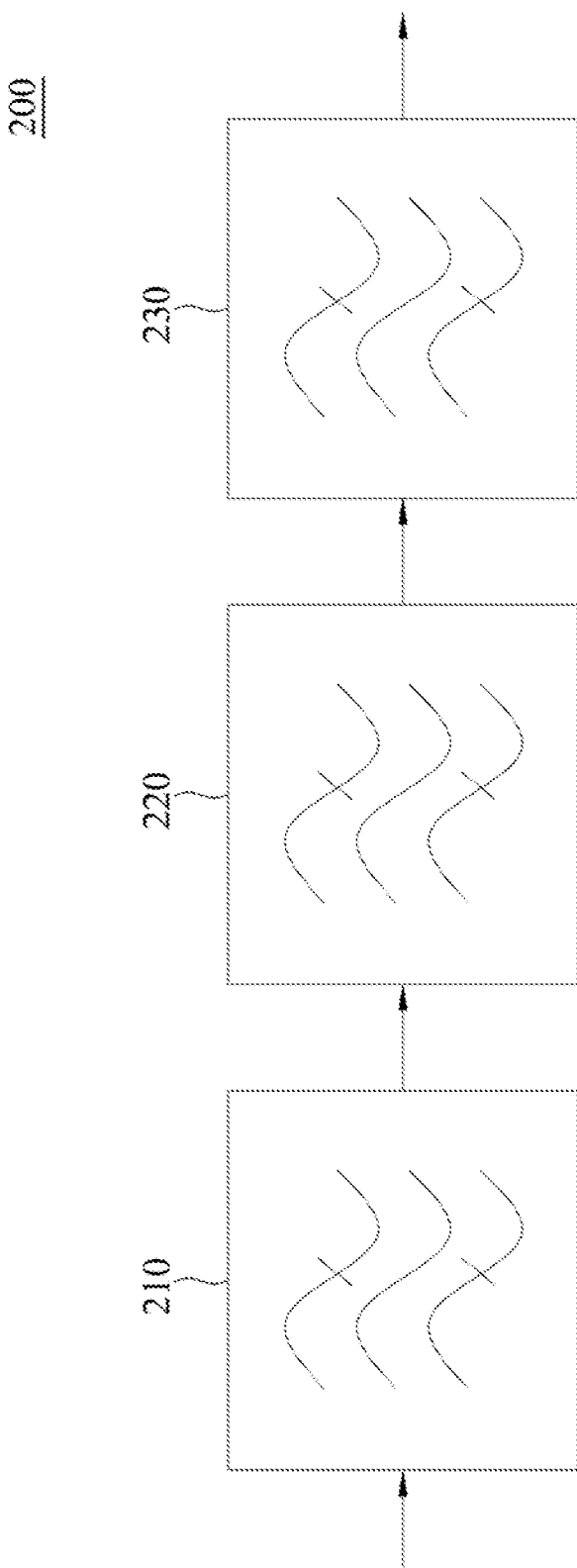
FIG. 2 is a simplified functional block diagram of a filter according to one embodiment of the present disclosure.

FIG. 2 is a simplified functional block diagram of a filter 200 according to one embodiment of the present disclosure. The filter 200 comprises band-pass filters 210-230, but the filter 200 is not limited to be implemented with a three-stage band-pass filter. In some embodiments, the filter 200 comprises at least a stage of band-pass filter. The first-stage band-pass filter 210 may be implemented with the filter 100 in FIG. 1. Other band-pass filters may be implemented with a combination of the first low-pass filter 110, the second low-pass filter 120 and the third resistor array MR3 of FIG.

1. The output of the previous-stage band-pass filter may be used as the input of the next-stage band-pass filter, i.e., the output signals VOP, VON, VOQP and VOQN, may be used as the input signals VIN, VIP, VIQN and VIQP of the next stage.

Figure 3:
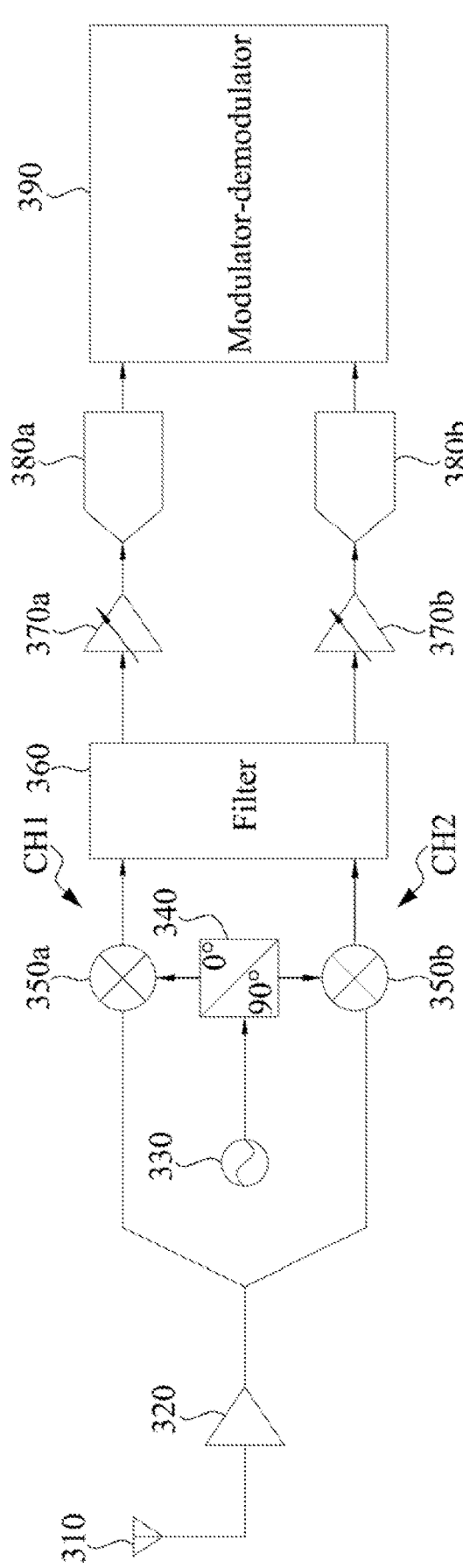
FIG. 3 is a simplified functional block diagram of a receiver according to one embodiment of the present disclosure.

FIG. 3 is a simplified functional block diagram of a receiver 300 according to one embodiment of the present disclosure. The receiver 300 comprises an antenna 310, an amplifier 320 (e.g., a low-noise amplifier), a local oscillator 330, a phase-shifter 340, frequency mixers 350a-350b, a filter 360, amplifiers (e.g., programmable gain amplifiers) 370a-370b, analog-to-digital converters (ADCs) 380a-380b and a modulator-demodulator 390.

The antenna 310 is configured to receive radio frequency signals. Radio frequency signals are sent to the frequency mixers 350a-350b after being amplified by the amplifier 320. The phase-shifter 340 is configured to convert two-phase clock signals generated by local oscillator 330 to four-phase clock signals, in which clock signals with phases 0° and 180° are provided to the frequency mixer 350a, and clock signals with phases 90° and 270° are provided to the frequency mixer 350b. The frequency mixers 350a-350b are configured to convert a radio frequency signal to a first-order downconverted signal, such as a medium frequency signal. The frequency mixers 350a-350b are further configured to generate complex signals according to the first-order down-converted signal by, for example, dividing the first-order downconverted signal into a real-part signal in the first channel CH1 (e.g., an in-phase signal in the I-path) and an imaginary-part signal in the second channel CH2 (e.g., a quadrature signal in the Q-path). In other words, the frequency mixer 350a may be configured to generate input signals VIN and VIP in FIG. 1, and the frequency mixer 350b may be configured to generate input signals VIQN and VIQP in FIG. 1.

A filter 360 may be realized by a filter 200 in FIG. 2. The filter 360 is configured to filter image signals in the first-order downconverted signal, in which output signals of the filter 360 to the first channel CH1 and the second channel CH2 are transmitted to amplifiers 370a-370b, respectively. Output signals of the filter 360 are amplified and converted by the amplifiers 370a-370b and the ADCs 380a-380b and inputted to the modulator-demodulator 390. The modulator-demodulator 390 is configured to process received signals to generate digital data signals and send to post-stage circuits (not depicted). The modulator-demodulator 390 is further configured to adjust circuit parameters of the filter 360 according to received signals, so as to compensate the gain-mismatch (i.e., the inequality between the gains) and the phase-mismatch (i.e., the phase difference is not 90°) between the first channel CH1 and the second channel CH2, so as to enhance the image-rejection ratios of the first channel CH1 and the second channel CH2. In some embodiments, the image-rejection ratio is the power of a target signal divided by the power of an image signal.

Figure 4B:
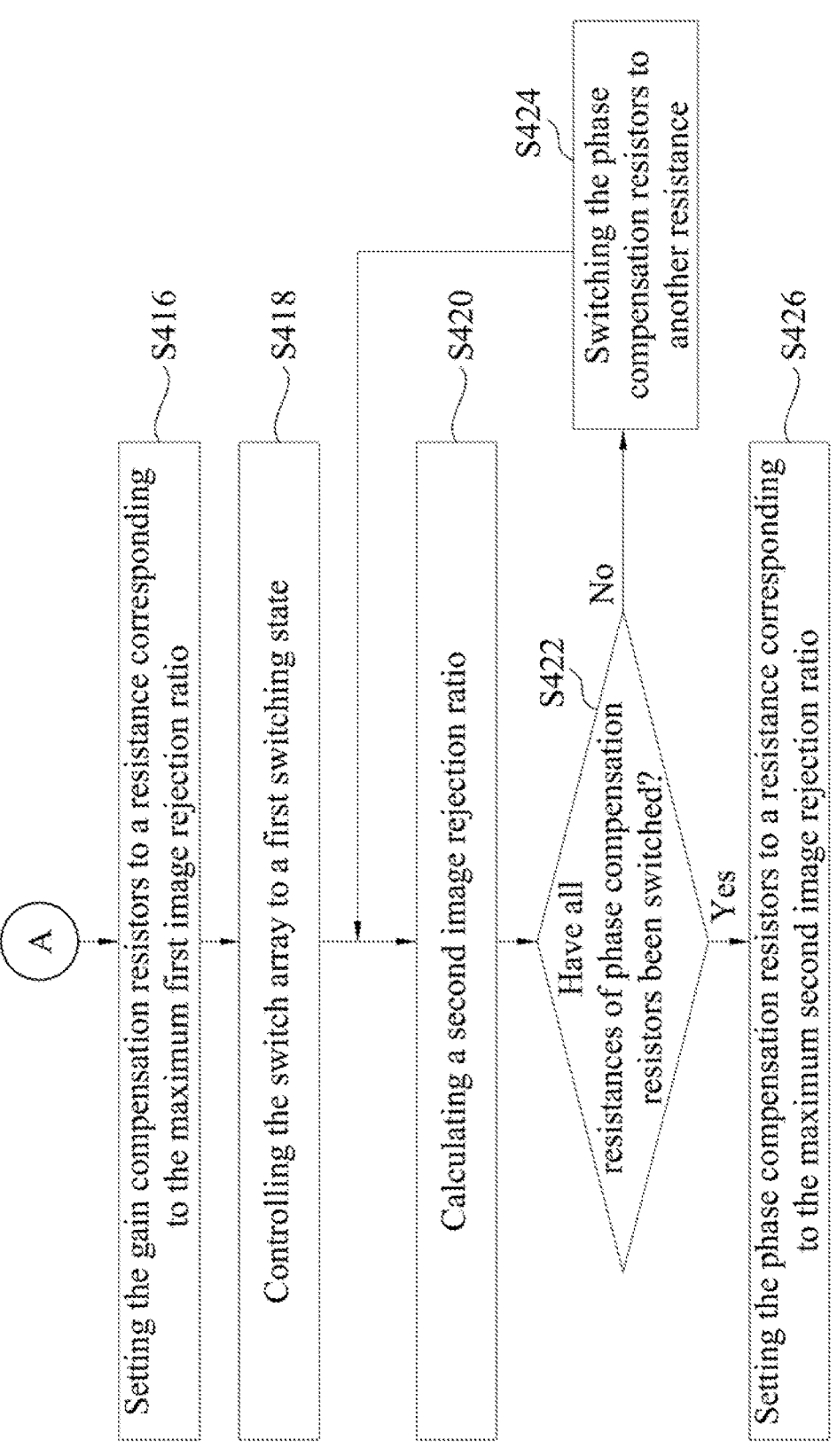
FIG. 4B is a flowchart of a calibration method according to one embodiment of the present disclosure.

FIG. 4A-FIG. 4B is a flowchart of a calibration method 400 according to one embodiment of the present disclosure, in which the calibration method 400 may be conducted by the modulator-demodulator 390. In step S402, the modulator-demodulator 390 sets the resistances of phase compensation resistors RC1-RC2 in the fourth resistor array MR4 to the maximum resistance (e.g., 0.4MΩ) among a plurality of switchable resistances, so that the fourth resistor array MR4 is equivalent to an open circuit.

In some embodiments, the third switch DW3 and the fourth switch DW4 in FIG. 1 may further connect the second terminals of the phase compensation resistors RC1-RC2 to a ground terminal, that is, the third switch DW3 and the fourth switch DW4 are single-pole three-throw switches. In this situation, the modulator-demodulator 390 controls the third switch DW3 and the fourth switch DW4 to ground the second terminals of the phase compensation resistors RC1-RC2 in step S402, and there is no need for the modulator-demodulator 390 to set the phase compensation resistors RC1-RC2 to the maximum resistance.

In step S404, the modulator-demodulator 390 set the gain compensation resistors R1a-R1b in the first resistor array MR1 and the second resistor array MR2 to an initial resistance, for example, the minimum resistance among a plurality of resistances that the gain compensation resistors R1a-R1b can be switched. Afterwards, in step S406, the modulator-demodulator 390 calculates initial image rejection ratios of the first channel CH1 and the second channel CH2 respectively according to signals received from the ADCs 380a-380b.

In step S408, a modulator-demodulator 390 determines a channel to be optimized in following steps according to the initial image rejection ratios of the first channel CH1 and the second channel CH2. More specifically, in following steps, the modulator-demodulator 390 further enhances (optimizes) an image rejection ratio of a channel with a larger (better) initial image rejection ratio. For the convenience of explanation, the following assumes that the initial image rejection ratio of the first channel CH1 is larger than the initial image rejection ratio of the second channel CH2, therefore the modulator-demodulator 390 will further enhance the image rejection ratio of the first channel CH1.

In step S410, the modulator-demodulator 390 switches the gain compensation resistors R1a-R1b to another resistance. Afterwards, in step 412, the modulator-demodulator 390 calculates an image rejection ratio of the first channel CH1 in this situation according to signals received from the ADC 380a.

In step S414, the modulator-demodulator 390 determines whether all resistances of the gain compensation resistors R1a-R1b are switched. If so, the modulator-demodulator 390 conducts step S416; if not, the modulator-demodulator 390 repeats steps S410-S412. In other words, the modulator-demodulator 390 repeats steps S410-S412 for a plurality of times to record a plurality of first image rejection ratios respectively corresponding to all switchable resistances of the gain compensation resistors R1a-R1b.

In some embodiments, the gain compensation resistors R1a-R1b have the same resistances in steps S404-S412. For example, each of the gain compensation resistors R1a-R1b may be switched between nine different resistances in a range of 0.6-7 kΩ. The modulator-demodulator 390 may set both gain compensation resistors R1a-R1b to 0.6 kΩ in step S410. The modulator-demodulator 390 may set the gain compensation resistors R1a-R1b to different resistances in the following eight times of step S410.

In step S416, a modulator-demodulator 390 determines the maximum first image rejection ratio among the plurality of first image rejection ratios. The modulator-demodulator 390 also sets the resistances of the gain compensation resistors R1a-R1b to a resistance corresponding to the maximum first image rejection ratio. For example, if setting both gain compensation resistors R1a-R1b to 4.6 kΩ induces the maximum first image rejection ratio, then gain compensation resistors R1a-R1b are set to 4.6 kΩ in step S416. In some embodiments, if the plurality of first image rejection ratios are all less than the initial image rejection ratio, then the gain compensation resistors R1a-R1b are set to the initial resistance in step S416.

Afterwards, in step S418, the modulator-demodulator 390 controls the switch array MSW to be a first switching state depicted in FIG. 1. In steps S402-S416, since the fourth resistor array MR4 is equivalent to an open circuit or to be grounded, the switch array MSW may be in an arbitrary switching state.

In step S420, the modulator-demodulator 390 calculates a second image rejection ratio of a first channel CH1 in this situation according to signals received from the ADC 380a. Afterwards, in step S422, the modulator-demodulator 390 determines whether all resistances of phase compensation resistors RC1-RC2 have been switched. If not, the modulator-demodulator 390 will conduct step S424 afterwards to switch the phase compensation resistors RC1-RC2 to another resistance, and after step S424 ends the modulator-demodulator 390 will repeat step S420. In other words, the modulator-demodulator 390 will repeat steps S420-S424 for a plurality of times to record a plurality of second image rejection ratios respectively corresponding to all switchable resistances of the phase compensation resistors RC1-RC2.

In some embodiments, the phase compensation resistors RC1-RC2 have the same resistance in steps S420-S424.

If the determination in step S422 is "YES," then the modulator-demodulator 390 will conduct step S426, where the modulator-demodulator 390 determines the maximum second image rejection ratio among the plurality of second image rejection ratios. The modulator-demodulator 390 also set the phase compensation resistors RC1-RC2 to a resistance corresponding to the maximum second image rejection ratio. In some embodiments, after step S426 ends, the resistance of each of the phase compensation resistors RC1-RC2 is approximately an integral multiple of the resistance of each of the gain compensation resistors R1a-R1b, for example, 9-57 times.

Aforementioned steps S410-S416 calibrate gain-mismatches of the first channel CH1 and the second channel CH2 by adjusting gain compensation resistors R1a-R1b, so as to enhance the image rejection ratio of the first channel CH1. Steps S418-S426 calibrate phase-mismatches of the second channel CH2 and the first channel CH1 by adjusting phase compensation resistors RC1-RC2, so as to further enhance the image rejection ratio of the first channel CH1. Accordingly, although phase compensation needs a larger resistance, by using the switch array MSW to select a channel to apply phase compensation, the fourth resistor array MR4 only need to comprise two resistors to compensate a single channel, and does not need to comprise four resistors to compensate two channels, which helps reduce the total circuit area.

It is worth mentioning that if, in step S408, the modulator-demodulator 390 determines that the image rejection ratio of the second channel CH2 needs to be further enhanced, then the modulator-demodulator 390 will calculate the first image rejection ratio of the second channel CH2 according to signals received from the ADC 380b in step S412; in step S418, modulator-demodulator 390 will control the switch array MSW to be in the second switching state; and in step S420, the modulator-demodulator 390 will calculate the second image rejection ratio of the second channel CH2 according to signals received from the ADC 380b.

Figure 5:
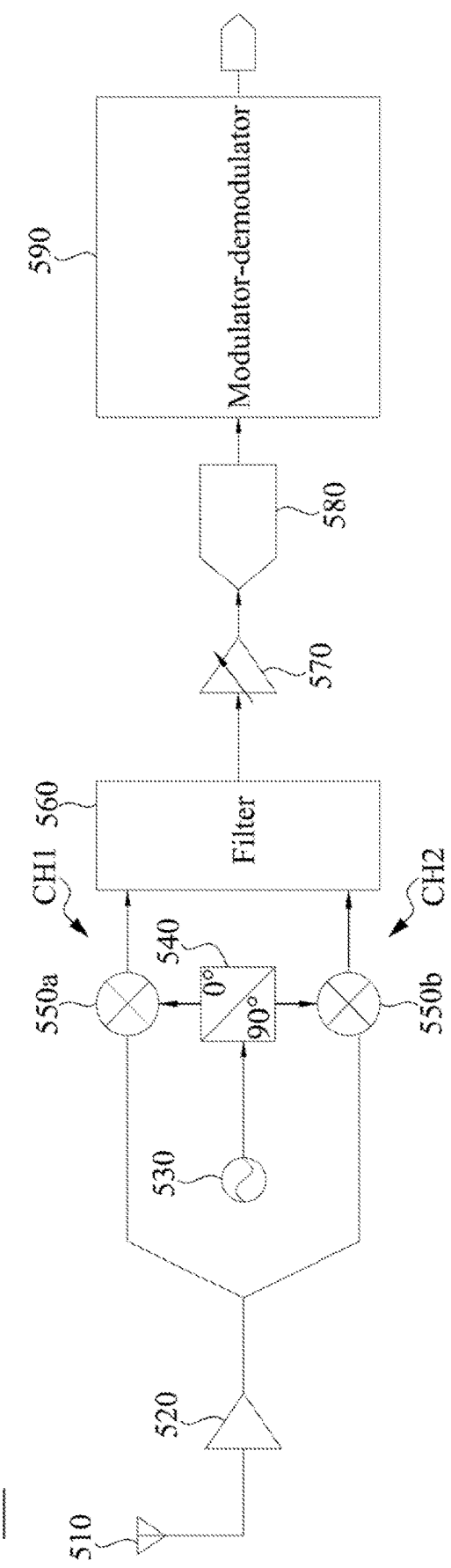
FIG. 5 is a simplified functional block diagram of a receiver according to one embodiment of the present disclosure.

FIG. 5 is a simplified functional block diagram of a receiver 500 according to one embodiment of the present disclosure. In some embodiments, the receiver 500 is applicable to Bluetooth communication, but the present disclosure is not limited thereto. The receiver 500 comprises an antenna 510, an amplifier 520 (e.g., a low-noise amplifier), a local oscillator 530, a phase-shifter 540, frequency mixers 550a-550b, a filter 560, an amplifier 570 (e.g., a programmable gain amplifier), an ADC 580 and a modulator-demodulator 590. Except the filter 560, the amplifier 570, the ADC 580 and the modulator-demodulator 590, the rest elements of the receiver 500 are similar to corresponding elements in the receiver 300 in FIG. 3, respectively. For the sake of brevity, the detailed descriptions thereof are omitted here.

The amplifier 570 and the ADC 580 are configured to receive output signals from one of a first channel CH1 and a second channel CH2 of the filter 560, then amplify and convert the received output signals to the modulator-demodulator 590. The difference between the filter 560 and the filter 360 in FIG. 3 is that the filter 560 needs no switch array MSW. If the amplifier 570 and the ADC 580 are configured to receive output signals from the first channel CH1, the fourth resistor array MR4 of the filter 560 is configured to connect the first channel CH1 to the second low-pass filter 120, that is, similar to the connection manner of the aforementioned first switching state. On the other hand, if the amplifier 570 and the ADC 580 are configured to receive output signals from the second channel CH2, the fourth resistor array MR4 of the filter 560 is configured to connect the second channel CH2 to the first low-pass filter 110, that is, similar to the connection manner of the aforementioned second switching state.

In addition, when the modulator-demodulator 590 is conducting the aforementioned calibration method 400, steps S408 and S418 can be skipped. Accordingly, since the receiver 500 comprises only a set of amplifier 570 and ADC 580, the receiver 500 may have a further reduced circuit area.

As used herein, "around", "about" or "approximately" shall generally mean within 20 percent, preferably within 10 percent, and more preferably within 5 percent of a given value or range. Numerical quantities given herein are approximate, meaning that the term "around", "about" or "approximately" can be inferred if not expressly stated.

Certain terms are used in the specification and the claims to refer to specific components. However, those of ordinary skill in the art would understand that the same components may be referred to by different terms. The specification and claims do not use the differences in terms as a way to distinguish components, but the differences in functions of the components are used as a basis for distinguishing. Furthermore, it should be understood that the term "comprising" used in the specification and claims is open-ended, that is, including but not limited to. In addition, "coupling" herein includes any direct and indirect connection means. Therefore, if it is described that the first component is coupled to the second component, it means that the first component can be directly connected to the second component through electrical connection or signal connections including wireless transmission, optical transmission, and the like, or the first component is indirectly electrically or signally connected to the second component through other component(s) or connection means.

It will be understood that, in the description herein and throughout the claims that follow, the phrase "and/or" includes any and all combinations of one or more of the associated listed items. Unless the context clearly dictates otherwise, the singular terms used herein include plural referents.

Although the present disclosure has been described in considerable detail with reference to certain embodiments thereof, other embodiments are possible. Therefore, the spirit and scope of the appended claims should not be limited to the description of the embodiments contained herein. It will be apparent to those skilled in the art that various modifications and variations can be made to the structure of the present disclosure without departing from the scope or spirit of the present disclosure. In view of the foregoing, it is intended that the present disclosure cover modifications and variations of this disclosure provided they fall within the scope of the following claims and their equivalents.

What is claimed is:

1. A filter, comprising:
a first low-pass filter located at a first channel, comprising a first resistor array coupled to a complex-signal input terminal;
a second low-pass filter located at a second channel, comprising a second resistor array coupled to the complex-signal input terminal, wherein the complex-signal input terminal is configured to provide complex signals to the first channel and the second channel;
a third resistor array cross coupled between the first low-pass filter and the second low-pass filter; and
a fourth resistor array coupled between the complex-signal input terminal and the third resistor array, wherein the first resistor array, the second resistor array and the fourth resistor array comprise variable resistors, wherein the fourth resistor array is selectively coupled to input terminals of either the first low-pass filter or the second low-pass filter.

2. The filter of claim 1, further comprising:
a switch array, wherein the fourth resistor array is coupled between the complex-signal input terminal and the third resistor array through the switch array,
wherein a first switching state of the switch array is configured to connect the first channel to the second low-pass filter through the fourth resistor array, and a second switching state of the switch array is configured to connect the second channel to the first low-pass filter through the fourth resistor array.

3. The filter of claim 2, wherein the fourth resistor array comprises a first phase compensation resistor and a second phase compensation resistor, and the switch array comprises:
a first switch configured to connect a first terminal of the first phase compensation resistor to a non-inverting input terminal of the first low-pass filter or to a non-inverting input terminal of the second low-pass filter;
a second switch configured to connect a first terminal of the second phase compensation resistor to an inverting input terminal of the first low-pass filter or to an inverting input terminal of the second low-pass filter;
a third switch configured to connect a second terminal of the first phase compensation resistor to the non-inverting input terminal of the second low-pass filter or to the non-inverting input terminal of the first low-pass filter; and
a fourth switch configured to connect a second terminal of the second phase compensation resistor to the inverting input terminal of the second low-pass filter or to the inverting input terminal of the first low-pass filter.

4. The filter of claim 2, wherein the fourth resistor array comprises a first phase compensation resistor and a second phase compensation resistor, and the switch array comprises:
a first switch configured to connect a first terminal of the first phase compensation resistor to a non-inverting input terminal of the first low-pass filter or to a non-inverting input terminal of the second low-pass filter;

a second switch configured to connect a first terminal of the second phase compensation resistor to an inverting input terminal of the first low-pass filter or to an inverting input terminal of the second low-pass filter;
a first single-pole three-throw switch configured to connect a second terminal of the first phase compensation resistor to the non-inverting input terminal of the second low-pass filter, the non-inverting input terminal of the first low-pass filter or a ground terminal; and
a second single-pole three-throw switch configured to connect a second terminal of the second phase compensation resistor to the inverting input terminal of the second low-pass filter, the inverting input terminal of the first low-pass filter or the ground terminal.

5. The filter of claim 1, wherein resistance of each resistor in the fourth resistor array is an integral multiple of resistance of each resistor in the first resistor array and the second resistor array.

6. The filter of claim 1, wherein the third resistor array is configured to connect a non-inverting input terminal and an inverting input terminal of the first low-pass filter to an inverting output terminal and a non-inverting output terminal of the second low-pass filter, respectively,
wherein the third resistor array is further configured to connect a non-inverting output terminal and an inverting output terminal of the first low-pass filter to a non-inverting input terminal and an inverting input terminal of the second low-pass filter.

7. A receiver configured to process radio frequency signals, comprising:
a first low-pass filter located at a first channel, comprising a first resistor array coupled to a complex-signal input terminal;
a second low-pass filter located at a second channel, comprising a second resistor array coupled to the complex-signal input terminal, wherein the complex-signal input terminal is configured to provide complex signals to the first channel and the second channel;
a third resistor array cross coupled between the first low-pass filter and the second low-pass filter;
a fourth resistor array coupled between the complex-signal input terminal and the third resistor array; and
a modulator-demodulator configured to determine resistance of the first resistor array, the second resistor array and the fourth resistor array according to the complex signals received from at least one of the first channel and the second channel.

8. The receiver of claim 7, wherein the modulator-demodulator is configured to:
calculating a plurality of first image rejection ratios of the first channel corresponding to different resistance of the first resistor array and the second resistor array;
determining resistance of each resistor in the first resistor array or the second resistor array according to a maximum value of the plurality of first image rejection ratios;
calculating a plurality of second image rejection ratios of the first channel corresponding to different resistance of the fourth resistor array; and
determining resistance of each resistor in the fourth resistor array according to a maximum value of the plurality of second image rejection ratios.

9. The receiver of claim 8, wherein when calculating the plurality of first image rejection ratios, the modulator-demodulator is configured either to set each resistor in the fourth resistor array to a maximum resistance or to ground the fourth resistor array.

10. The receiver of claim 9, further comprising:

a switch array controlled by the modulator-demodulator, wherein the fourth resistor array is coupled between the complex-signal input terminal and the third resistor array through the switch array, and when calculating the plurality of second image rejection ratios, the modulator-demodulator is configured to:

control the switch array to connect a first terminal of the fourth resistor array to inverting and non-inverting input terminals of the first low-pass filter; and control the switch array, to connect a second terminal of the fourth resistor array to inverting and non-inverting input terminals of the second low-pass filter, and to inverting and non-inverting output terminals of the first low-pass filter through the third resistor array.

11. The receiver of claim 7, further comprising:

a switch array controlled by the modulator-demodulator, wherein the fourth resistor array is coupled between the complex-signal input terminal and the third resistor array through the switch array, wherein a first switching state of the switch array is configured to connect the first channel to the second low-pass filter through the fourth resistor array, and a second switching state of the switch array is configured to connect the second channel to the first low-pass filter through the fourth resistor array.

12. The receiver of claim 11, wherein the fourth resistor array comprises a first phase compensation resistor and a second phase compensation resistor, and the switch array comprises:

a first switch configured to connect a first terminal of the first phase compensation resistor to a non-inverting input terminal of the first low-pass filter or to a non-inverting input terminal of the second low-pass filter;

a second switch configured to connect a first terminal of the second phase compensation resistor to an inverting input terminal of the first low-pass filter or to an inverting input terminal of the second low-pass filter;

a third switch configured to connect a second terminal of the first phase compensation resistor to the non-inverting input terminal of the second low-pass filter or to the non-inverting input terminal of the first low-pass filter; and a fourth switch configured to connect a second terminal of the second phase compensation resistor to the inverting input terminal of the second low-pass filter or to the inverting input terminal of the first low-pass filter.

13. The receiver of claim 11, wherein the fourth resistor array comprises a first phase compensation resistor and a second phase compensation resistor, and the switch array comprises:

a first switch configured to connect a first terminal of the first phase compensation resistor to a non-inverting input terminal of the first low-pass filter or a non-inverting input terminal of the second low-pass filter;

a second switch configured to connect a first terminal of the second phase compensation resistor to an inverting input terminal of the first low-pass filter or an inverting input terminal of the second low-pass filter;

a first single-pole three-throw switch configured to connect a second terminal of the first phase compensation resistor to the non-inverting input terminal of the second low-pass filter, the non-inverting input terminal of the first low-pass filter or a ground terminal; and a second single-pole three-throw switch configured to connect a second terminal of the second phase compensation resistor to the inverting input terminal of the second low-pass filter, the inverting input terminal of the first low-pass filter or the ground terminal.

14. The receiver of claim 7, further comprising a first analog-to-digital converter (ADC), wherein among an output signal of the first low-pass filter and an output signal of the second low-pass filter, only the output signal of the first low-pass filter is inputted to the modulator-demodulator through the ADC, so that the modulator-demodulator computes a plurality of image rejection ratios of the first channel according to the output signal of the first low-pass filter, and determines the resistance of the first resistor array, the second resistor array and the fourth resistor array according to the plurality of image rejection ratios of the first channel.

15. The receiver of claim 7, wherein resistance of each resistor in the fourth resistor array is an integral multiple of resistance of each resistor in the first resistor array and the second resistor array.

16. A calibration method for calibrating a receiver comprising a first low-pass filter and a second first low-pass filter, wherein the first low-pass filter is located at a first channel and comprises a first resistor array coupled to a complex-signal input terminal, and the second low-pass filter is located at a second channel and comprises a second resistor array coupled to the complex-signal input terminal, and the receiver further comprises a third resistor array cross coupled between the first low-pass filter and the second low-pass filter, wherein the calibration method comprises:

calculating a plurality of first image rejection ratios of the first channel corresponding to different resistance of the first resistor array and the second resistor array;

determining resistance of each resistor in the first resistor array or the second resistor array according to a maximum value of the plurality of first image rejection ratios;

calculating a plurality of second image rejection ratios of the first channel corresponding to different resistance of a fourth resistor array of the receiver, wherein the fourth resistor array is coupled between the third resistor array and the complex-signal input terminal, and the complex-signal input terminal is configured to provide complex signals to the first channel and the second channel; and determining resistance of each resistor in the fourth resistor array according to a maximum value of the plurality of second image rejection ratios.

17. The calibration method of claim 16, wherein calculating the plurality of first image rejection ratios comprising:

setting each resistor in the fourth resistor array to maximum resistance or grounding the fourth resistor array.

18. The calibration method of claim 17, wherein the fourth resistor array is coupled between the complex-signal input terminal and the third resistor array through a switch array of the receiver, and computing the plurality of second image rejection ratios of the first channel comprising:

controlling the switch array to connect a first terminal of the fourth resistor array to inverting and non-inverting input terminals of the first low-pass filter; and controlling the switch array to connect a second terminal of the fourth resistor array to inverting and non-inverting input terminals of the second low-pass filter.

19. The calibration method of claim 16, wherein before calculating the plurality of first image rejection ratios, the calibration method further comprising:

computing a first initial image rejection ratio of the first channel and a second initial image rejection ratio of the second channel, respectively, wherein in response to the first initial image rejection ratio being larger than the second initial image rejection ratio, calculate the plurality of first image rejection ratios of the first channel.

20. The calibration method of claim 16, wherein resistance of each resistor in the fourth resistor array is an integral multiple of the resistance of each resistor in the first resistor array and the second resistor array.

\* \* \* \* \*